United States Patent [19]

Ida et al.

[11] Patent Number: 4,503,467

[45] Date of Patent: Mar. 5, 1985

[54] ANALOG-DIGITAL CONVERTING APPARATUS

[75] Inventors: Masatoshi Ida, Hachioji; Kenichi Oinoue, Tokyo; Masahiro Aoki, Fussa; Asao Hayashi, Hachioji, all of Japan

[73] Assignee: Olympus Optical Co., Ltd., Japan

[21] Appl. No.: 361,436

[22] Filed: Mar. 24, 1982

[30] Foreign Application Priority Data

Mar. 28, 1981 [JP] Japan ................................. 56-46093

[51] Int. Cl.³ .......................... H04N 3/12; G06K 9/38
[52] U.S. Cl. .........:............................ 358/212; 358/213; 382/50
[58] Field of Search ............... 382/50, 52, 53; 250/204, 578, 208, 209, 214 C, 214 DC; 307/311, 358, 360, 361; 358/221, 212, 213, 280, 160, 227, 209; 354/402, 408, 409; 352/140

[56] References Cited

U.S. PATENT DOCUMENTS

| | | | |
|---|---|---|---|
| 3,502,993 | 3/1970 | Schürzinger et al. | 382/53 |
| 3,778,768 | 12/1973 | Brisk et al. | 382/50 |
| 4,159,432 | 6/1979 | Burke et al. | 382/53 |
| 4,255,654 | 3/1981 | Suzuki et al. | 250/204 |
| 4,283,137 | 8/1981 | Tsunekawa et al. | 250/204 |
| 4,402,087 | 8/1983 | Sakamoto et al. | 382/53 |
| 4,420,742 | 12/1983 | Tadanchi et al. | 382/50 |

Primary Examiner—John C. Martin
Assistant Examiner—Michael D. Parker
Attorney, Agent, or Firm—Parkhurst & Oliff

[57] ABSTRACT

In an analog-digital converting apparatus including a row of light receiving units with each unit having a light receiving element and a sample-hold circuit, a counter for producing a digital signal whose value is increased successively, a digital-analog converter for receiving the digital signal and producing an analog reference signal whose amplitude increases successively from a lower limit value to an upper limit value in step-shaped manner, comparators for comparing the output signals of the light receiving units with said analog reference signal, respectively, memories for receiving the digital signal and controlled by the comparators, respectively to store instantaneous digital values when the corresponding comparators change their states, there is provided a second light receiving unit having substantially the same construction as that of the first mentioned light receiving unit except that a light receiving element provided therein is covered with a light shielding mask so as to produce an output equivalent to a dark current component of the light receiving element, the output of which unit is used as a lower limit voltage source for said digital-analog converter. The apparatus may further include a third light receiving unit having substantially the same as that of the first light receiving unit except that the light receiving element is removed and the input of the sample-hold circuit is connected to a supply voltage so as to produce an output equivalent to a saturation value of the light receiving element, the output of which unit is used as an upper limit voltage source for the digital-analog converter.

22 Claims, 11 Drawing Figures

ANALOG-DIGITAL CONVERTING APPARATUS

BACKGROUND OF THE INVENTION

This invention relates to a method and apparatus for converting analog output signals of a plurality of light receiving elements forming a photoelectric converting device to digital signals.

One of such analog-digital converting methods and apparatuses has been known from U.S. Pat. No. 4,255,654. In this known method and apparatus output photoelectric signals of a number of light receiving elements are simultaneously sampled and held by means of sample and hold circuits each connected to respective light receiving elements. The photoelectric signals thus held are supplied to one inputs of a number of comparators, respectively, to the other inputs of which is commonly supplied an analog reference signal whose amplitude varies successively in step-shaped manner. A number of digital memories are provided, to which memories a digital signal whose value varies successively according to the analog reference signal is applied in parallel and each of which memories is controlled by means of one of the comparators to store an instantaneous value of the digital signal which is supplied thereto just when the corresponding comparator changes its state. The digital signals stored in the memories are then read out therefrom as analog-digital converted output signals under the control of a central controller.

According to this analog-digital converting method and apparatus, all of the analog photoelectric signals held in the sample and hold circuits are converted into digital signals in parallel within a short time interval during which the analog reference signal varies from its lower limit value to its upper limit value, so that a number of analog photoelectric signals can be converted to digital signals at a very high speed. Accordingly, if this converting method is used for detecting a focus condition of a camera etc., the focus condition can be detected correctly for a fast moving object.

However, in the above mentioned analog-digital converting apparatus and method an analog-digital conversion range is determined by the analog reference signal varying in stepwise manner whose lower and upper limit values are fixed. Therefore if the output signals of the light receiving elements whose dark current or dark voltage increases with an increase of ambient temperature are converted to digital signals, a dynamic range of the analog-digital conversion is reduced with the increase of ambient temperature, because a dynamic range of the output signals of the light receiving elements is reduced with the increase of ambient temperature so that a lower step portion of the analog reference signal does not contribute to the analog-digital conversion.

FIG. 1 illustrates the relation between the dynamic range of the analog-digital conversion and the dark current component of the light receiving element which component increases with temperature increase. In the prior method and apparatus the analog-digital conversion of the output signals of the light receiving elements is effected within a range between the fixed lower and upper limit values of the analog reference signal. Therefore, it can be seen from FIG. 1 that if the dark current component of the light receiving element increases with temperature increase, an effective portion or range of the reference signal which contributes to the analog-digital conversion is reduced. As a result the dynamic range of the analog-digital conversion is reduced with temperature increase and thus the accuracy of the analog-digital conversion is decreased.

SUMMARY OF THE INVENTION

An object of the invention is to provide improved analog-digital converting method and apparatus in which the above mentioned problem is overcome.

Accordingly the invention provides a method for converting analog output signals of a plurality of light receiving elements included in a photoelectric converting device into digital signals comprising a step of sampling and holding the output signals of the light receiving elements, a step of comparing the sampled and holded signal with an analog reference signal the amplitude of which varies successively in step-shaped manner between lower and upper limit values by means of respective comparators, a step of supplying digital signal whose value varies successively in correspondence with said analog reference signal to memories corresponding to the comparators, a step of storing instantaneous values of the digital signal into the memories when the corresponding comparators change their states, and a step of using an output from a light receiving element having a light shielding mask applied thereon as said lower limit value of said analog reference signal.

The invention further provides an analog-digital converting apparatus comprising a row of first light receiving units, each unit comprising a light receiving element and a sample-hold circuit for sampling and holding the output signal of the light receiving element, means for generating an analog reference signal whose amplitude varies successively in step-shaped manner, means for generating digital signals whose value varies successively in correspondence with said analog reference signal, a plurality of comparator circuits each having one input is connected to said sample-hold circuits, respectively and the other inputs of which are commonly connected to said analog reference signal generating means and compares the signals held in said sample-hold circuits with said analog reference signal, a plurality of digital memory data inputs which are connected to said digital signal generating means and write control inputs are connected to said comparator circuits, respectively so that the memories store instantaneous values of the digital signal from the digital signal generating means when the corresponding comparator circuits change their states, and at least one second light receiving unit arranged in said light receiving unit row and producing an output voltage which is substantially equal to a dark voltage of said light receiving elements, the output voltage of which unit is applied to said analog reference signal generating means as a lower limit voltage source for producing the lower limit value of the analog reference signal.

DETAILED DESCRIPTION OF THE PREFERRED EMBODIMENTS

Figure 2:
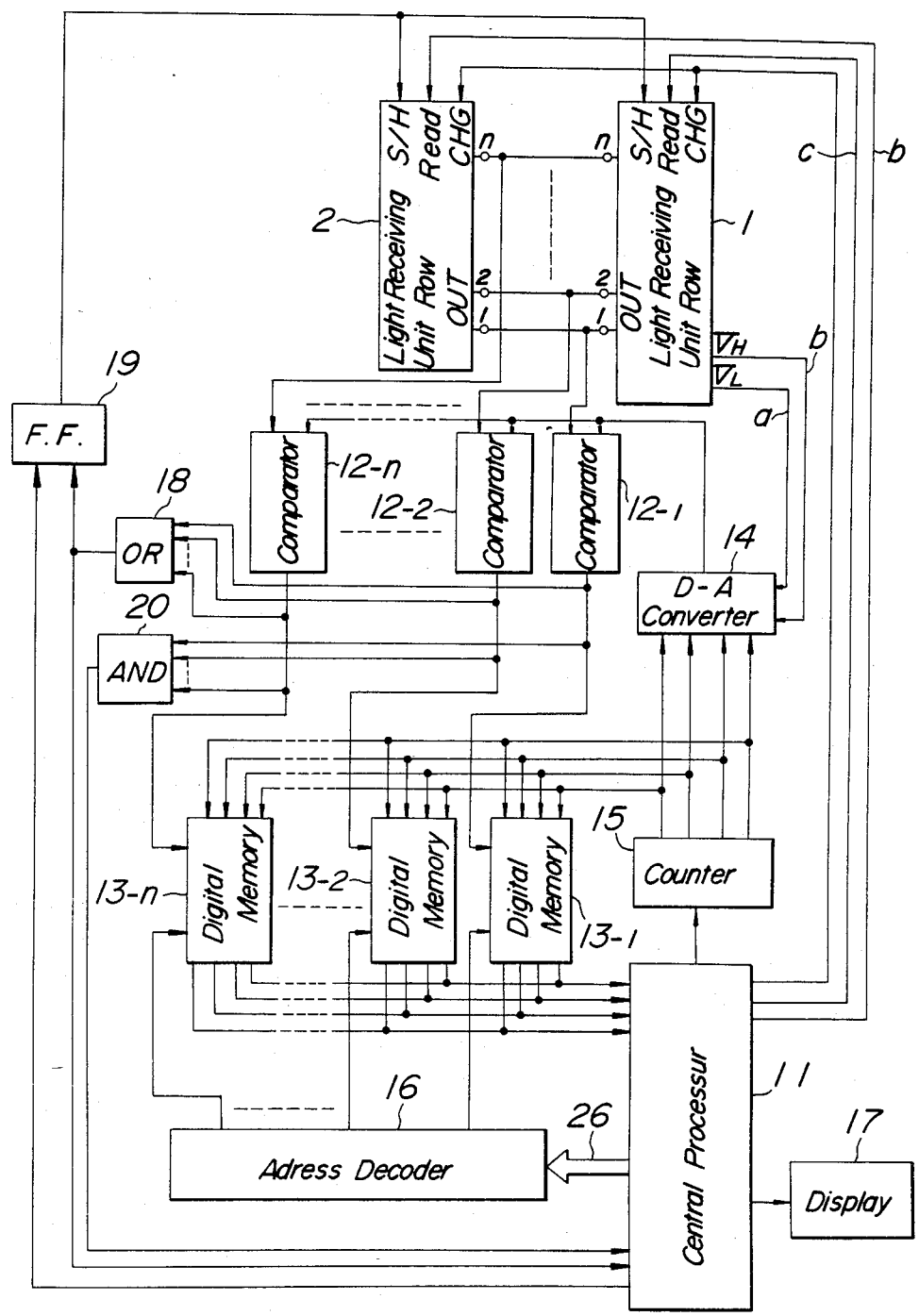
FIG. 2 is a block diagram of one embodiment of an analog-digital converting apparatus according to the invention.

Referring to FIG. 2 there is shown, in block diagram, one embodiment of analog-digital converting apparatus according to the invention which is incorporated in an apparatus for detecting a focal point of optical devices such as cameras or the like.

Figure 3A:
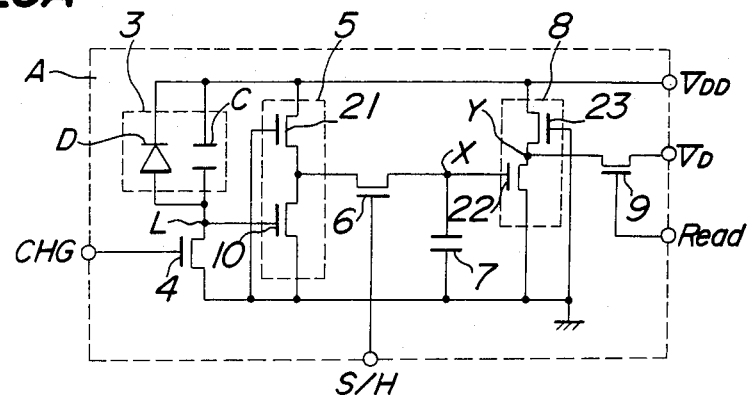
FIG. 3A is a circuit diagram of an embodiment of a light receiving unit A which produces an photoelectric signal in response to incident light thereon.

The apparatus comprises a pair of light receiving unit rows 1 and 2, each of which rows includes a plurality of light receiving units. As shown in FIG. 3A, the light receiving unit A comprises a light receiving element such as a photo diode and a sample-hold circuit for sampling and holding the output signal of the light receiving element. The detailed construction of this light receiving unit A will be fully described hereinafter.

The light receiving unit rows 1 and 2 are arranged in front and rear of a predetermined focal plane and at equidistances therefrom, respectively, so that the rows 1 and 2 receive front and rear focussed images projected by the optical device, respectively.

The two light receiving unit rows 1 and 2 are alternately operated by means of a central processor 11 to supply the photoelectric output signals of the light receiving units in each row to comparators 12-1~12-n, respectively and the photoelectric signals are compared therein with an analog reference signal the amplitude of which increases successively in step-shaped manner. This analog reference signal is generated by a digital-analog converter 14 to which converter a digital signal whose digital values are increased in succession is applied from a counter 15 driven by the central processor 11. The digital signal from the counter 15 is also supplied to data inputs of digital memories 13-1~13-n in parallel, write control inputs of which memories are connected to the outputs of the comparators 12-1~12-n, respectively so that the memories store digital values applied thereto just when the corresponding comparators change their states. This means that the digital signals stored in the memories correspond to the analog output signals of the respective light receiving units.

The digital signals stored in the memories 13-1~13-n are read out successively in response to read out signals supplied from an address decoder 16 driven by address signals from the central processor 11 and then are applied to the central processor 11. The central processor 11 calculates an estimate value from the output digital signals derived from each light receiving unit row according to a predetermined estimation function and compares the estimate values thus obtained for the two light receiving unit rows with each other to detect a correct focus condition, a front focus condition or a rear focus condition.

Figure 1:
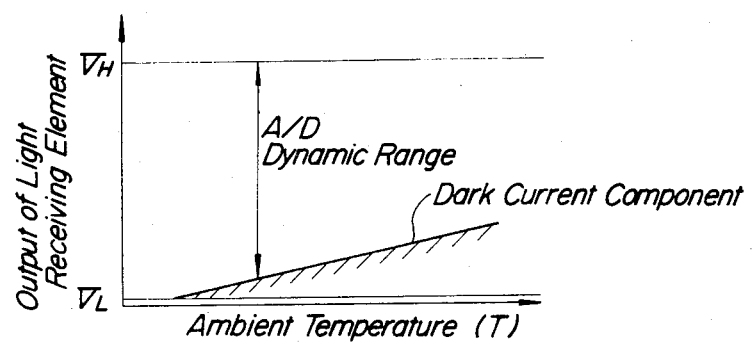
FIG. 1 shows a relation between a dynamic range of the analog-digital conversion and ambient temperatures.

As described with reference to FIG. 1, the above described analog-digital converting apparatus has a drawback that the analog-digital conversion range and accuracy are reduced as an ambient temperature is increased.

Figure 3B:
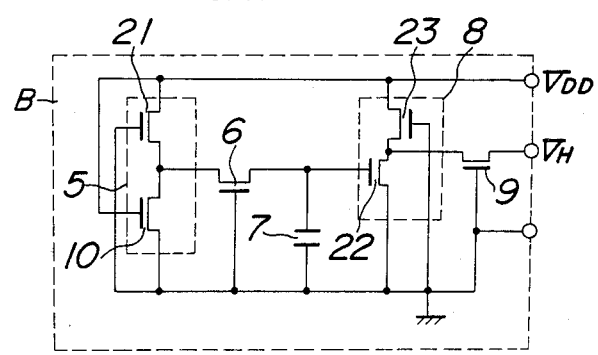
FIG. 3B is a circuit diagram of an embodiment of a light receiving unit B operating as an upper limit voltage source for the digital-analog converter in FIG. 2.
Figure 3C:
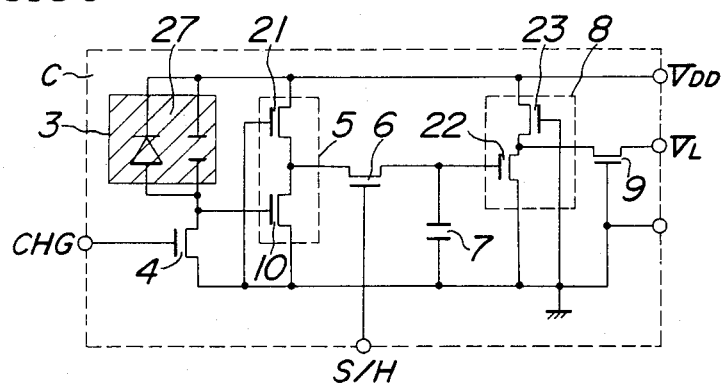
FIG. 3C is a circuit diagram of an embodiment of a light receiving unit C operating as a lower limit voltage source for the digital-analog converter.

According to the invention, in order to eliminate the above drawback at least one of the light receiving unit rows 1 and 2 is further provided with a light receiving unit B shown in FIG. 3B having substantially the same configuration as that of the light receiving unit A shown in FIG. 3A except that an input of the sample-hold circuit therein is directly connected to a supply voltage terminal $V_{DD}$ so as to produce an output voltage substantially equal to a saturation value of the output of the light receiving element at all times and/or a light receiving unit C illustrated in FIG. 3C having substantially the same configuration as that of the light receiving unit A shown in FIG. 3A except that the light receiving element therein is fully covered with a light shielding mask so as to produce an output voltage substantially equal to a dark voltage of the light receiving element at all times. These additional light receiving units B and C are called hereinafter an "upper limit voltage source unit" and "lower limit voltage source unit", respectively and will be described hereinafter in detail.

Figure 4:
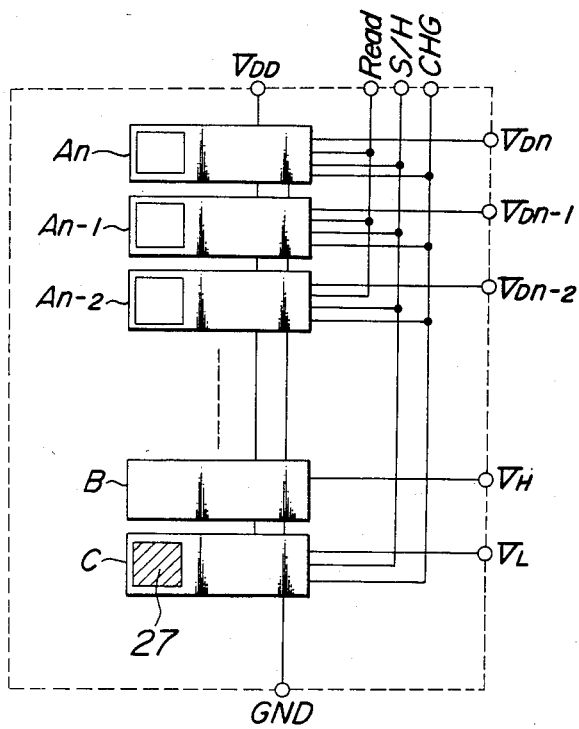
FIG. 4 is a diagrammatic view showing an arrangement of the light receiving unit row in FIG. 2.

In the embodiment of FIG. 2, the light receiving unit row 1 comprises in addition to n light receiving units $A_1$-$A_n$ as shown in FIG. 3A one upper limit voltage source unit B shown in FIG. 3B and one lower limit voltage source unit C shown in FIG. 3C (see FIG. 4). The output voltage $V_L$ produced by the unit C is applied through a line a to the digital-analog converter 14 and used therein as a voltage source for producing the lower limit value of the analog-digital reference signal. In this embodiment the output $V_H$ produced by the unit B is also applied through a line b to the digital-analog converter 14 and used therein as a voltage source for producing the upper limit value of the analog reference signal.

Figure 5:
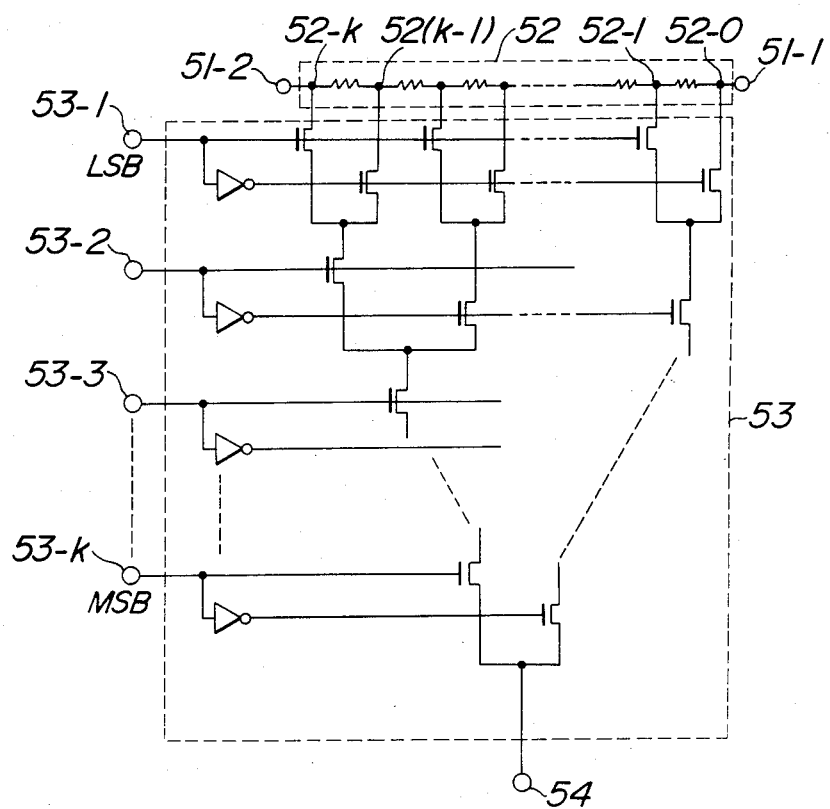
FIG. 5 is a circuit diagram of an embodiment of the digital-analog converter in FIG. 2.

FIG. 5 shows a circuit arrangement of an embodiment of the digital-analog converter 14. As stated above the digital-analog converter 14 receives from the counter 15 the digital signal whose digital values are increased in succession and converts it into the analog reference signal the amplitude of which increases successively in step-shaped manner from the lower limit value to the upper limit value. The digital-analog converter 14 comprises a voltage divider 52 having 2K-1 resistors connected in series between supply voltage terminals 51-1 and 51-2, wherein K is a positive integer equal to the number of bits of the counter 15. The taps 52-0, 52-1, ... 52-K of the divider 52 are connected to a switching network 53 in the form of tree structure. The switching network operates in response to the successive outputs of the counter 15 supplied to control inputs thereof 53-1, 53-2, . . . 53-K to connect the taps 52-0, 52-1, . . . 52-K to output 54 thereof in succession, so that an analog reference signal increasing in step-shaped manner appears on the output 54.

As stated above, according to the invention the output voltage produced by the units C and B and substantially equal to the dark and saturation voltages of the light receiving element are applied to the supply terminals 51-1 and 51-2 as the lower and upper limit voltage sources of the analog-digital converter 14, respectively, so that an analog reference signal can be produced by this converter 14 which increase from a lower limit value equal to the dark voltage to an upper limit value equal to the saturation voltage in step-shaped manner. Thus the lower and upper limit values of the analog reference signal vary depending on the dark and saturation current variation of the light receiving element due to the temperature variation so that the digital-analog conversion range becomes optimum at all times independently of the temperature variation and thus the digital-analog conversion can be achieved accurately with an optimum dynamic range.

Now, the light receiving unit A shown in FIG. 3A, the upper limit voltage source unit B shown in FIG. 3B and the lower limit voltage source unit C shown in FIG. 3C will be described in detail.

The light receiving unit A illustrated in FIG. 3A comprises a photo diode 3 represented by a parallel circuit of a capacitor C and a diode D, a charging gate FET 4, a first (input) buffer 5 comprising FETs 10 and 21, a sample-hold gate FET 6, a hold capacitor 7, a second (output) buffer 8 comprising FETs 22 and 23 and a read gate FET 9.

The photo diode 3 is connected at one end to the voltage supply terminal $V_{DD}$ and at the other end to the ground via the charging gate FET 4 and to the gate electrode of the FET 10 in the first buffer 5.

The FET 10 of the first buffer 5 is connected at one of main electrodes to the voltage supply terminal $V_{DD}$ through the FET 21 and at the other main electrode to the ground together with the gate electrode of the FET 21. The junction between the FETs 21 and 10 is connected through the sample-hold gate FET 6 to one end of the hold capacitor 7 and the gate electrode of the FET 22 in the second buffer 8. The other end of the hold capacitor 7 is connected to the ground.

One of main electrodes of the FET 22 in the second buffer 8 is connected to the voltage supply terminal $V_{DD}$ through the FET 23 whose gate electrode is connected to the ground. The junction of the two FETs 22 and 23 is connected to the voltage supply terminal $V_{DD}$ through the read gate FET 9 whose gate electrode is connected to an input "Read" for a selection control signal.

The gate electrodes of the charging gate FET 4 and the sample-hold gate FET 6 are connected to an input "CHG" for a charging control signal and an input "S/H" for a sample-hold control signal, respectively.

The light receiving unit A as described above operates as follows. In the initial state, assuming that the charging control signal is at high level so that the charging gate FET 4 is non-conductive, the sample-hold control signal is at low level so that the sample-hold gate FET 6 is conductive and the read signal is at low level so that the read gate FET 9 is conductive, a voltage at a point L is equal to the supply voltage from the voltage supply terminal $V_{DD}$ and thus the FET 10 is non-conductive. Thus, the hold capacitor 7 is charged from the supply voltage $V_{DD}$ through the normally conductive FET 21 to a high voltage, which in turn turns off the FET 22 so that the supply voltage $V_{DD}$ is applied through the normally conductive FET 23 and the read gate 9 to the output terminal $V_D$.

In this condition, when the charging control signal becomes low level during a predetermined time period, the charging gate FET 4 is turned on to decrease the potential at the point L to the ground potential, so that the capacitor C in the photo diode 3 is charged to the supply voltage $V_{DD}$. At the same time the FET 10 is turned on to discharge the charge in the hold capacitor 7 so that a potential at a point X to a very low value which in turn turns on the FET 22 to decrease the potential at the point Y to a very low value.

When the charging control signal applied to the input CHG returns to its initial high level to turn off the charging gate FET 4, the charge stored in the capacitor C is discharged through the diode D at a rate which is determined by a photoelectric current flowing therethrough which depends on the intensity of the incident light on the photo diode 3, so that the potential at the point L is increased with this discharging. As a result of this the FET 10 is turned off gradually so that the hold capacitor 7 is charged gradually and thus the potential at the point X is increased gradually, which in turn turns off the FET 22 gradually and thus the potential at the point Y is also increased gradually. This means that the holding capacitor 7 is charged by a charging current depending on the intensity of the incident light on the photo diode 3 and hence the potential at the points X and Y are increased at a rate depending on the intensity of the incident light.

During the charging of the holding capacitor 7 when the sample-hold control signal applied to the input S/H is made high level, the sample-hold gate FET 6 is turned off to disconnect the holding circuit from the supply voltage $V_{DD}$ so that voltage charged in the capacitor 7 is held therein and thus the voltage at the point Y is maintained at a value proportional to the intensity of the incident light on the related photo diode 3. The sample-hold control signal may be produced by means of the central processor 11 and may be made high level at a predetermined instant. Alternatively, the sample-hold signal may be advantageously produced in the following manner.

During the charging of the holding capacitor 7 the increasing voltage at the point Y in each unit A is read out through the read gate FET 9 and applied to the corresponding comparator 12-1~12-n and compared therein with a predetermined constant reference voltage which may be advantageously derived from the output voltage $V_H$ of the upper limit voltage source unit B. The output of each comparator 12-1~12-n is connected through an OR circuit 18 to a flip-flop 19 for producing the sample-hold control signal, so that when any one of the comparators changes its state the flip-flop 19 is driven by the output of this comparator to change its output level, that is to say the signal level of the sample-hold control signal changes from low level to high level. At this time the above mentioned sample and hold operation is effected.

After the sample and hold operation, the output voltage maintained at the point Y of each light receiving unit A in each row 1, 2 is read out through the read gate FET 9 and applied to the corresponding comparator 12-1~12-n and compared therein with the analog reference signal from the digital-analog converter 14. The output of each comparator 12-1∼12-n controls the corresponding digital memory 13-1∼13-n to which the digital signal having the digital values which change in accordance with the stepwise change of the analog reference signal, so that the digital value corresponding to that step of the analog reference signal which corresponds to the output voltage of the corresponding light receiving unit is stored in the corresponding memory in previously described manner.

When the comparison in all of the comparators 12-1∼13-n, that is to say the analog-digital conversions for all of the units A has been completed, an AND circuit having inputs connected to the comparators 12-1∼13-n produces an output signal which is then applied as a digital-analog conversion end signal to the central processor 11. The processor 11 responds to this end signal to read out the contents in the memories 13-1∼13-n. The processor further operates the flip-flop 19 to change the signal level of the sample-hold control signal S/H into the initial low level, whereby the initial state is established again and the above operations can be repeated.

The above mentioned analog-digital conversion for the two light receiving unit rows 1 and 2 is effected alternately. To this end the read gate FETs 9 in each row are switched on and off by means of a control signal applied to the input terminal "Read" from the central processor 11.

The upper and lower limit voltage source units B and C shown in FIGS. 3B and 3C are essential for the present invention. The unit B supplies at all times an output voltage $V_H$ corresponding to the maximum or saturation output of the light receiving unit A of FIG. 3A. To this end, in this unit B the photo diode 3 in the unit A of FIG. 3A is removed and the gate electrode of the FET 10 of the input buffer 5 is connected to the voltage supply terminal $V_{DD}$ so as to produce the output voltage $V_H$ corresponding to the maximum or saturation output which is obtained when the resistance of the photo diode 3 is zero. The gate electrode of the read gate FET 9 is connected to the ground so that the output voltage $V_H$ appears on the output terminal $V_D$ at all times.

The lower limit voltage source unit C shown in FIG. 3C supplies at all times an output voltage $V_L$ corresponding to the minimum or dark output which is obtained in the unit A of FIG. 3A when the photo diode carries only a dark current. To this end, in this unit C a light shielding mask 27 is provided above the photo diode 3. The gate electrode of the read gate FET 9 is connected to ground so that the output voltage $V_L$ appears on the output terminal $V_D$ at all times.

In the embodiment illustrated in FIG. 2, the first and second light receiving units arranged at one end of the row 1 are constructed as shown in FIGS. 3C and 3B (see FIG. 4) whose output voltages $V_L$ and $V_H$ are supplied through the lines a and b, respectively to the digital-analog converter 14 and used therein as voltage sources for the upper and lower limits of the analog reference signal, respectively.

Figure 6:
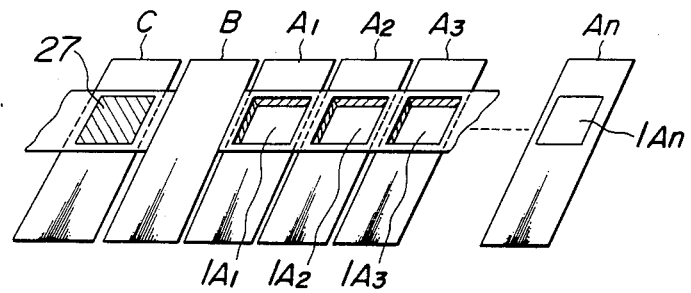
FIG. 6 is a diagrammatic view showing the construction of the light receiving unit row of FIG. 4, and FIGS. 7A, 7B and 7C are circuit diagrams of second embodiments of the light receiving units A, B and C shown in FIGS. 3A, 3B and 3C, respectively.

FIG. 6 shows a practical embodiment of the light receiving unit row as shown in FIG. 4 in which the light receiving units $A_1$-$A_n$ each having the circuit arrangement of FIG. 3A and the light receiving units B and C having the circuit arrangements of FIGS. 3B and 3C, respectively are formed in one and same substrate. The units $A_1$-$A_n$ have light receiving windows $1A_1$-$1A_n$, respectively in which the photo diode are formed. In the unit B the photo diode is omitted and the input circuit is short-circuited as shown in FIG. 3B. Alternatively, instead of omitting the photo diode, the photo diode may be short circuited. In the unit C the light receiving window thereof is covered with the light shielding mask 27 which can be provided by any means such as an aluminum deposition and the like. In practice, the all units stated above are integrated in one IC chip.

According to the present invention a plurality of the units B and units C may be provided in one or both light receiving unit rows to obtain the upper and lower limit voltages equal to mean values of the output voltages of the units B and units C, respectively by connecting the outputs of the units B and units C in parallel, respectively. Further, in such instance that a temperature difference is present between the both ends of the light receiving unit row, the unit C whose output is considerably varied with a temperature may be arranged on each end of the row so that a more stable lower limit voltage equal to a mean value of the output voltages of these units C may be obtained by connecting the output of these units C in parallel.

Figure 7A:
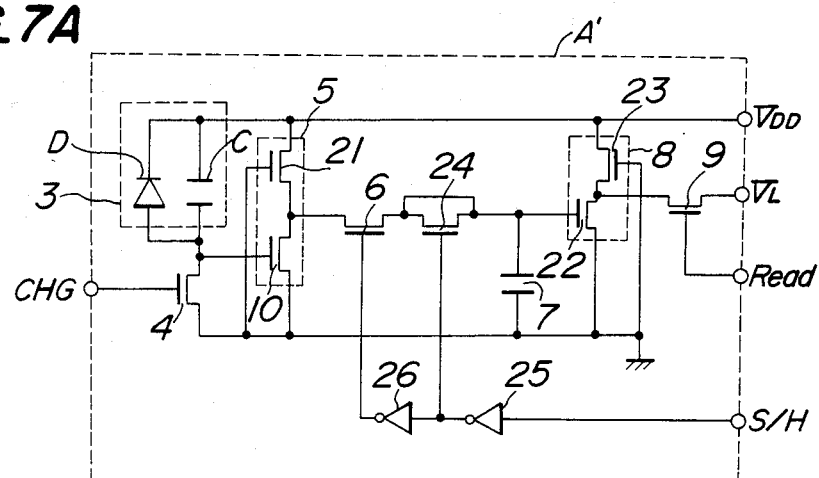
Figure 7B:
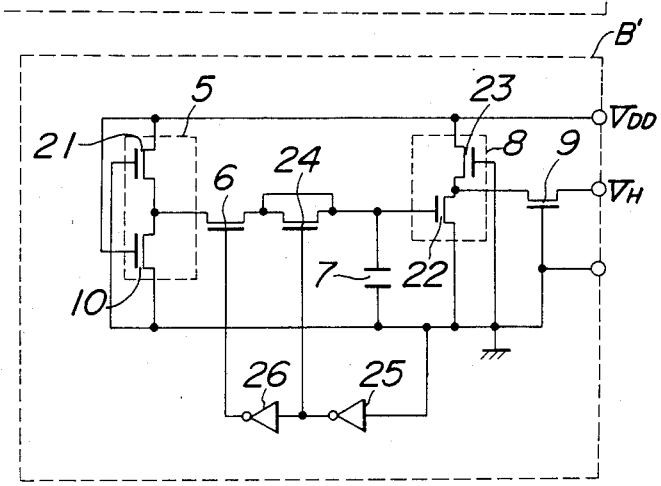
Figure 7C:
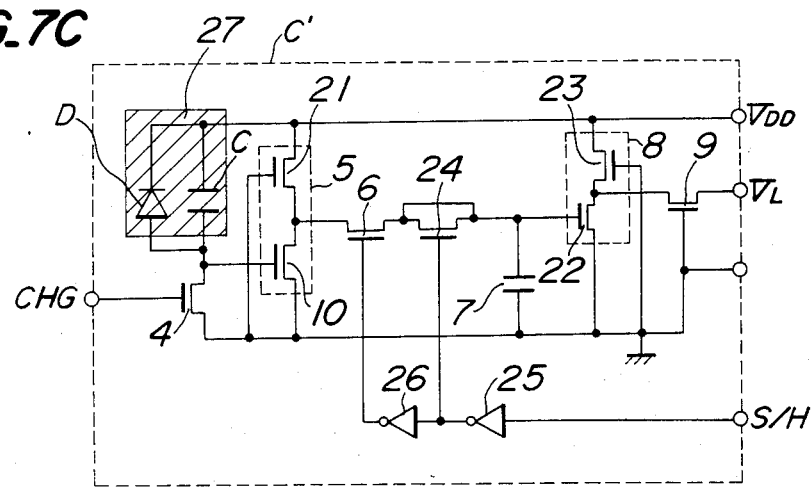

FIGS. 7A, 7B and 7C show the modified embodiments of the light receiving units A, B and C of FIGS. 3A, 3B and 3C, respectively.

The unit A', B' and C' of FIGS. 7A, 7B and 7C are the same in construction as those of FIGS. 3A, 3B and 3C except for that in the unit A', B' and C' an additional FET 24 whose drain and source electrodes are directly interconnected is inserted between the sample-hold gate FET 6 and the hold capacitor 7 and that the sample-hold control signal input terminal S/H is connected to the gate electrode of the FET 24 through an inverter 25 and to the gate electrode of the FET 6 through the inverter 25 and an inverter 26 so that the sample-hold control signals applied to the gates of the FETs 6 and 24 are made opposite in polarity to each other.

In the units as shown in FIG. 3 the sample-hold control signal might be differentiated by parasitic capacitances between the gate and source electrodes and between the gate and drain electrodes of the sample-hold gate FET 6 and the differentiated signal thus produced may be supplied to the hold capacitor 7 as a noise in addition to the output of the photo diode 3. However, in the units A', B' and C' of FIG. 7 the additional FET 24 between the sample-hold gate FET 6 and the hold capacitor 7 receives at its gate electrode the sample-hold control signal having the opposite polarity to that of the sample-hold control signal applied to the gate electrode of the sample-hold gate FET 6 so that the charges stored in the electrode capacitances of the sample-hold gate FET 6 are cancelled out by charges which are stored in the electrode capacitances of the additional FET 24 and opposite in polarity to the former charges.

As described above, according to the present invention at least the lower limit value of the analog reference signal is obtained from the dark voltage produced by the lower limit voltage source unit C which is arranged in the light receiving unit row and has the same temperature as that of the light receiving units A, so that decrease of the dynamic range of the analog-digital conversion due to the increase of the dark voltage of the light receiving element with the temperature increase can be suppressed and thus analog-digital conversion of the outputs of units A can be made in constant dynamic range at different temperatures.

Consequently, in the focal point detecting apparatus comprising the analog-digital converting apparatus according to the invention a focus condition can be detected in an accurate and precise manner independently of the variation of ambient temperature.

What is claimed is:

1. A method for converting analog output signals of a plurality of light receiving elements included in a photo-electric converting device into digital signals comprising:

sampling and holding the output signals of the light receiving elements;

comparing each sampled and held signal in a comparator with an analog reference signal the amplitude of which varies successively in step-shaped fashion between lower and upper limit values, said lower and upper limit values defining a dynamic range of analog-digital conversion;

supplying a digital signal to memories associated with each of the comparators, said digital signal having a value which varies successively in correspondence with said analog reference signal;

storing in said memories the instantaneous values of the digital signal when the comparator associated with that memory changes its state; and establishing said lower limit value of said dynamic range by supplying the output from a light receiving element having a light shielding mask applied thereon as the lower limit value of said dynamic range.

2. The method as claimed in claim 1, further comprising a step of using an output of a light receiving element which is equivalent to a saturation value of the light receiving elements as said upper limit value of the analog reference signal.

3. The method claim 1 wherein the output from said light receiving element having a light shielding mask applied thereto establishes said lower limit of said dynamic range while the other light receiving elements of said plurality of light receiving elements produce said analog output signals.

4. An analog-digital converting apparatus comprising:

a row of first light receiving units, each unit including a light receiving element and an associated sample and hold circuit coupled to sample and hold an output signal of the associated light receiving element;

means for generating an analog reference signal whose amplitude varies successively in a step-shaped fashion;

means for generating digital signals having values which vary successively in correspondence with said analog reference signal;

a plurality of comparator circuits each having one input which is connected to one of said sample and hold circuits and another input which is commonly connected to said analog reference signal generating means for comparing sampled and held signals with said analog reference signal;

a plurality of digital memories each having data inputs coupled to said digital signal generating means and write control inputs each of which are coupled to an associated comparator circuit in such a manner that said memories store instantaneous values of the digital signal from said digital signal generating means when said associated comparator circuit changes its state; and at least one second light receiving unit arranged in said light receiving unit row and producing an output voltage which is substantially equal to a dark voltage of said light receiving elements, said output voltage of said at least one second light receiving unit being applied to said analog reference signal generating means as the lower limit voltage for establishing the lower limit value of said analog reference signal.

5. The apparatus as claimed in claim 4, wherein a third light receiving unit for producing an output voltage which is substantially equal to a saturation voltage of said light receiving elements is provided in said light receiving unit row and the output voltage of this third unit is applied to said analog reference signal generating means as an upper limit voltage source for producing the upper limit value of the analog reference signal.

6. The apparatus as claimed in claim 4 or 5, wherein said second light receiving unit has a substantially same construction as that of the first light receiving unit except that a light receiving element provided therein is covered with a light shielding mask.

7. The apparatus as claimed in claim 4, wherein said digital signal generating means comprises a counter driven by clock pulses to produce the digital signal and said analog reference signal generating means comprises a digital-analog converter circuit which receives the digital signal generated by said counter.

8. The apparatus as claimed in claim 7, wherein said digital-analog converter circuit comprises a voltage divider having a plurality of taps and connected between two supply terminals to which the output voltages of the second and third units are supplied, respectively and a switching network which operates in response to the output signals of said counter to connect the taps to an output in succession, whereby an analog reference signal increasing from the dark voltage to the saturation voltage in step-shaped manner appears on said output.

9. The apparatus of claim 4 wherein the output voltage of said second light receiving unit is coupled to the analog reference signal generating means while the first light receiving units supply their outputs.

10. The apparatus of claim 9 wherein a third light receiving unit for producing an output voltage which is substantially equal to a saturation voltage of said light receiving elements is provided in said light receiving unit row and the output voltage of this third unit is applied to said analog reference signal generating means as an upper limit voltage source for establishing the upper limit value of said dynamic range within which said analog reference signal is varied.

11. An analog-digital converting apparatus comprising:

a row of first light receiving units, each unit including a light receiving element and an associated sample and hold circuit coupled to sample and hold an output signal of the associated light receiving element;

means for generating an analog reference signal whose amplitude varies successively in a step-shaped fashion;

means for generating digital signals having values which vary successively in correspondence with said analog reference signal;

comparator means having an input which is coupled to a respective one of said sample and hold circuits and another input which is coupled to said analog reference signal generating means for comparing sampled and held signals with said analog reference signal;

digital memory means having a data input coupled to said digital signal generating means and a write control input is coupled to an output of said comparator means in such a manner that said memory means stores an instantaneous value of the digital signal from said digital signal generating means when said comparator means changes its state; and at least one second light receiving unit arranged in said light receiving unit row and producing an output voltage which is substantially equal to a dark voltage of said light receiving elements, said output voltage of said at least one second light receiving unit being applied to said analog reference signal generating means as a lower limit voltage source for establishing the lower limit value of said analog reference signal.

12. The apparatus of claims 11 or 10 wherein said second light receiving unit is constructed substantially the same as said first light receiving unit except that a light receiving element in said second light receiving unit is covered with a light shielding mask.

13. The apparatus of claim 10 wherein said third light receiving unit is constructed substantially the same as a first light receiving unit except that the light receiving element of said third light receiving unit is removed and an input of the sample and hold circuit coupled to a supply voltage.

14. The apparatus of claim 10 wherein said third light receiving unit is constructed substantially the same as a first light receiving unit except that the light receiving element of said third light receiving unit is short-circuited.

15. The apparatus of claim 11 wherein said digital signal generating means comprises a counter driven by clock pulses to produce said digital signal and said analog reference signal generating means comprises a digital-analog converter circuit which receives said digital signal generated by said counter.

16. The apparatus of claim 15 wherein said digital-analog converter circuit comprises a voltage divider having a plurality of taps, said voltage divider being coupled between two supply terminals to which the output voltages of said second and third light receiving units are supplied and a switching network coupled to be responsive to the output signals from said counter to successively couple the taps to an output of said voltage divider such that an analog reference signal is provided on the output of said voltage divider which increases from the dark voltage to the saturation voltage in step-shaped fashion.

17. The apparatus of claim 16 wherein said voltage divider comprises a resistor ladder network.

18. An analog-digital converting apparatus comprising:

a row of first light receiving units, each unit including a light receiving element and an associated sample and hold circuit coupled to sample and hold an output signal of the associated light receiving element;

means for generating an analog reference signal whose amplitude varies successively in a step-shaped fashion;

means for generating digital signals having values which vary successively in correspondence with said analog reference signal;

a plurality of comparator circuits each having one input which is connected to one of said sample and hold circuits and another input which is commonly connected to said analog reference signal generating means for comparing sampled and held signals with said analog reference signal;

a plurality of digital memories each having data inputs coupled to said digital signal generating means and right control inputs each of which are coupled to an associated comparator circuit in such a manner that said memories store instantaneous values of the digital signal from said digital signal generating means when said associated comparator circuit changes its state;

at least one second light receiving unit arranged in said light receiving unit row and producing an output voltage which is substantially equal to a dark voltage of said light receiving elements, said output voltage of said at least one second light receiving unit being applied to said analog reference signal generating means as the lower limit voltage for establishing the lower limit value of said analog reference signal; and a third light receiving unit coupled in said light receiving unit row for producing an output voltage which is substantially equal to a saturation voltage of said light receiving elements, said output voltage of said third light receiving unit being coupled to said analog reference signal generating means as an upper limit voltage source for establishing the upper limit value of said analog reference signal, said third light receiving unit having substantially the same construction as said first light receiving units except that the light receiving element is removed and the input to the sample and hold circuit is coupled to a supply voltage.

19. An analog-digital converting apparatus comprising:

a row of first light receiving units, each unit including a light receiving element and an associated sample and hold circuit coupled to sample and hold an output signal of the associated light receiving element;

means for generating an analog reference signal whose amplitude varies successively in a step-shaped fashion;

means for generating digital signals having values which vary successively in correspondence with said analog reference signal;

a plurality of comparator circuits each having one input which is connected to one of said sample and hold circuits and another input which is commonly connected to said analog reference signal generating means for comparing sampled and held signals with said analog reference signal;

a plurality of digital memories each having data inputs each of which are coupled to said digital signal generating means and right control inputs each of which are coupled to an associated comparator circuit in such a manner that said memories store instantaneous values of the digital signal from said digital signal generating means when said associated comparator circuit changes its state;

at least one second light receiving unit arranged in said light receiving unit row and producing an output voltage which is substantially equal to a dark voltage of said light receiving elements, said output voltage of said at least one second light receiving unit being applied to said analog reference signal generating means as the lower limit voltage for establishing the lower limit value of said analog reference signal; and a third light receiving unit coupled in said light receiving unit row for producing an output voltage which is substantially equal to a saturation voltage of said light receiving elements, said output voltage of said third light receiving unit being coupled to said analog reference signal generating means as an upper limit voltage source for establishing the upper limit value of said analog reference signal, said third light receiving unit have substantially the same construction as a first light receiving unit except that its light receiving element is short-circuited.

20. A method for converting analog output signals of a plurality of light receiving elements included in a photoelectric converting device into digital signals comprising:

sampling and holding the output signals of the light receiving elements;

comparing each sampled and held signal in a comparator with an analog reference signal the amplitude of which varies successively in step-shaped fashion between lower and upper limit values, said lower and upper limit values defining a dynamic range of analog-digital conversion;

supplying a digital signal to memories associated with each of the comparators, said digital signal having a value which varies successively in correspondence with said analog reference signal;

storing in said memories the instantaneous values of the digital signal when the comparator associated with that memory changes its state; and changing at least one of said upper and lower limit values of said dynamic range within which said analog reference signal is varied.

21. A method for converting the analog output signal of at least one light receiving element into a digital signal comprising:

comparing the analog output signal of said at least one light receiving element with an analog reference signal having an amplitude varying over a dynamic range between upper and lower limits;

generating digital signals representing values of said analog reference signal over said dynamic range;

detecting the digital signal corresponding to the analog reference signal equaling said analog output signal from said at least one light receiving element; and establishing said lower limit of said dynamic range by using the output signal of a light receiving element having a light shielding mask covering that element.

22. An apparatus for converting the analog output signal of at least one light receiving element into a digital signal comprising:

means for comparing the analog output signal of at least one light receiving element with an analog reference signal having an amplitude varying over a dynamic range between upper and lower limits;

means for generating digital signals representing values of said analog reference signal over said dynamic range;

means for detecting the digital signal corresponding to the analog reference signal equaling said analog output signal from said at least one light receiving element; and means for establishing said lower limit of said dynamic range by using the output signal of a light receiving element having a light shielding mask covering that element.

* * * * *